US006743644B2

(12) United States Patent
Juengling

(10) Patent No.: US 6,743,644 B2
(45) Date of Patent: Jun. 1, 2004

(54) METHOD OF MAKING A METALLIZATION LINE LAYOUT

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/106,979

(22) Filed: Mar. 25, 2002

(65) Prior Publication Data

US 2002/0121651 A1 Sep. 5, 2002

Related U.S. Application Data

(62) Division of application No. 09/388,894, filed on Sep. 2, 1999, now Pat. No. 6,448,591, which is a continuation-in-part of application No. 08/514,988, filed on Aug. 14, 1995, now Pat. No. 5,981,384, and a continuation-in-part of application No. 08/971,869, filed on Nov. 19, 1997, now Pat. No. 5,965,940, which is a division of application No. 08/514,988, filed on Aug. 14, 1995, now Pat. No. 5,981,384.

(51) Int. Cl.[7] .............................................. H01L 31/26
(52) U.S. Cl. .................................... 438/14; 438/926
(58) Field of Search ........................... 438/14, 128, 691, 438/692, 689, 582, 706, 745, 926, 648, 683, 697

(56) References Cited

U.S. PATENT DOCUMENTS

| 4,584,079 A | 4/1986 | Lee et al. ................... 204/192 |
| 4,795,657 A | 1/1989 | Formigoni et al. .......... 365/100 |
| 4,818,723 A | 4/1989 | Yen .............................. 437/200 |
| 4,916,514 A | 4/1990 | Nowak ......................... 357/68 |
| 5,049,969 A | 9/1991 | Orbach et al. ................ 357/51 |
| 5,266,525 A | 11/1993 | Morozumi ................... 437/195 |
| 5,378,646 A | 1/1995 | Huang et al. ................. 437/47 |
| 5,453,406 A | 9/1995 | Chen ........................... 437/231 |
| 5,461,010 A | 10/1995 | Chen et al. .................. 437/228 |
| 5,494,853 A | 2/1996 | Lur .............................. 437/195 |
| 5,530,290 A | 6/1996 | Aitken et al. ................ 257/758 |
| 5,604,381 A | 2/1997 | Shen ........................... 257/773 |
| 5,631,478 A | 5/1997 | Okumura ..................... 257/211 |
| 5,639,688 A | 6/1997 | Delgado et al. ............. 437/191 |
| 5,639,697 A | 6/1997 | Weling et al. .............. 437/225 |
| 5,668,401 A | 9/1997 | Chao et al. .................. 257/620 |
| 5,702,985 A | 12/1997 | Burns ........................... 437/217 |
| 5,929,469 A | 7/1999 | Mimoto et al. .............. 257/208 |
| 6,002,155 A | 12/1999 | Tahara et al. ................ 257/207 |
| 6,194,914 B1 | 2/2001 | Sako ............................ 326/113 |
| 6,245,996 B1 | 6/2001 | Atakov et al. ............... 174/255 |
| 6,448,591 B1 * | 9/2002 | Juengling ..................... 257/211 |

* cited by examiner

*Primary Examiner*—David Nhu
(74) *Attorney, Agent, or Firm*—Workman Nydegger

(57) ABSTRACT

The present invention relates to metallization line layouts that minimize focus offset sensitivity by a substantial elimination of thin isolated metallization line segments that are inadequately patterned during formation of a mask. The present invention also relates to a metallization line layout that staggers unavoidable exposures. Embodiments of these metallization line layouts include enhanced terminal ends of isolated metallization lines, filled inter-metallization line spaces, and additional "dummy" metal shapes in open areas. The present invention also relates to a method of forming a metallization layer such that a substantially deposited, planarized interlayer dielectric layer can be formed without etchback or chemical-mechanical polishing.

14 Claims, 9 Drawing Sheets

METHOD OF MAKING A METALLIZATION LINE LAYOUT

RELATED APPLICATIONS

This application is a divisional of U.S. patent application Ser. No. 09/388,894, filed on Sep. 2, 1999 now U.S. Pat. No. 6,448,591, which is a continuation-in-part of U.S. patent application Ser. No. 08/514,988, filed on Aug. 14, 1995, now U.S. Pat. No. 5,981,384, and a continuation- in-part of U.S. patent application Ser. No. 08/971,869, filed on Nov. 19, 1997, now U.S. Pat. No. 5,965,940, which is a divisional of U.S. patent application Ser. No. 08/514,988, filed on Aug. 14, 1995, now U.S. Pat. No. 5,981,384, all of which being incorporated herein by reference.

BACKGROUND OF THE INVENTION

1. The Field of the Invention

The present invention relates to the fabrication of microelectronic semiconductor devices. More particularly, the present invention relates to the fabrication of metallization lines. In particular, the present invention relates to a metallization line layout optimization to avoid depth of field sensitivity and excess reflectance in isolated metallization lines. Additionally, the present invention achieves a substantially planar dielectric layer upper surface, upon deposition and without further processing, of the dielectric layer over the inventive metallization line layout.

2. The Relevant Technology

In the microelectronics industry, a substrate refers to one or more semiconductor layers or structures which includes active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductive substrates described above.

Following the formation of semiconductor devices, the devices need to be electrically connected, either to themselves or to the outside world to make the semiconductor device function as part of a greater whole. The electrical connection of the semiconductor devices is carried out by the metallization process. Metallization comprises the layout and patterning of a series of electrically conductive lines upon an upper surface of a substrate. The metallization lines make electrical connection, through either vias or interconnects, between individual semiconductor devices and/or the outside world.

FIG. 1 illustrates a plan view of a typical "Manhattan" style metallization line layout 10, by way of non-limiting example, at least a portion of a metal-1 layout for a sense amplifier. A Manhattan style metallization layout may also be called a rectangular, or right-angle rectilinear metallization layout. Such a metallization layout is characterized by raised, elongate structures that have only substantially right-angle deviations from being straight or linear. The term "vertical" is intended to mean a direction between the top and bottom of the page of a figure. The term "lateral" is intended to means a sideways direction of a figure, substantially orthogonal to "vertical."

Referring to FIG. 1, arbitrary region Z is seen in FIG. 1 to have a substantially rectangular shape that includes parallel vertical boundaries 15, 15' and parallel horizontal boundaries 17, 17'. Metallization lines include isolated lines and may be shown as having an end 11 within an arbitrary region Z. Metallization lines include continuous lines and are shown as extending substantially across FIG. 1 with no end found within arbitrary region Z. For example, isolated line 1-left (isolated line 1L) is defined as having end 11 within arbitrary region Z of metallization line layout 10, and arbitrary region Z does not include a physical edge of metallization line layout 10. An "end" 11 is defined as a portion of a metallization line that discontinues within arbitrary region Z and that has a length that may be substantially the width W of the metallization line for a length along the same metallization line at least equal to the distance W.

It is noted that in the prior art "Manhattan" layout of metallization line layout 10, ends 11 for all of isolated lines 1R–11R are all a fixed distance 27 from a closest vertical boundary 15 of arbitrary region Z, or a fixed distance 29 from a closest boundary 15'.

A continuous line is defined as having no end within arbitrary region Z of metallization line layout 10. For example, continuous line 3 has no end within arbitrary region Z depicted as FIG. 1. Continuous line 3 has an enlarged feature 13.

FIG. 1 illustrates several occurrences of isolated lines and continuous lines. As used herein, an "intersection" is defined as a subregion within arbitrary region Z at which at least one end of a metallization line occurs. The four top-most metallization lines in FIG. 1 are demarcated as isolated lines 1L and 2L and isolated lines 1R and 2R. The next metallization line down is a continuous metallization line and is thus demarcated as continuous line 3.

An intersection is defined as a portion of a layout with at least one end 11. The intersection may be bordered by a continuous line. For example, a 6-way intersection occurs at the demarcation X where it can be seen that a 6-arrowed illustrative figure has been drawn to demonstrate the 6-way nature of this intersection. Intersection X is bordered by continuous lines 6 and 9. Intersection X includes the spaces between continuous line 6, isolated line 7L, isolated line 8L, isolated line 7R, isolated line 8R, and continuous line 9.

A 4-way intersection may be considered as occurring at the demarcation Y where it can be seen that a 4-arrowed illustrative figure has been drawn. The 4-way intersection is thus defined as an open region having ends 11, that has a clear line of sight, for example between isolated lines 10L and 11L, between isolated lines 10L and 10R, between isolated lines 10R and 11R, and between isolated lines 11R and 11L. A 3-way intersection maybe considered as occurring in FIG. 1A at the demarcation V where it can be seen that a 3-arrowed illustrative figure has been drawn near end 11. This intersection is thus created by an open region that has a clear line of sight between isolated line 2L and continuous line 1, between continuous line 1 and continuous line 3, and between continuous line 3 and isolated line 2L. Thus, by this definition, an intersection represents the space between a plurality of metallization lines, wherein at least one metallization line has an end that creates at least a portion of the space therebetween.

The metallization lines have been fabricated in the past at a minimum width and as far apart as possible in order to avoid the problems of capacitative coupling and shorting. While the advantages of avoiding capacitative coupling and shorting are preferred, the ever-increasing pressure to miniaturize microelectronic devices influences the design engineer to decrease the overall scale of a metallization line layout. This decrease gives rise to at least three significant problems for the process engineer.

The first significant problem is the focus offset sensitivity or depth of field capability of existing photolithographic exposure equipment. The equipment's focus offset sensitivity may cause significant problems during patterning of isolated metallization lines. As photolithographic exposure wavelengths become less optimal due to the ever-decreasing scale of the layout, focus offset sensitivity will blur the edges of the metallization line mask. Thereby the entire exposure of the metallization line mask may be excessively blurred, the mask may fail to form, and no metallization line may result. Excessive blurring can cause the problem of an open circuit. This problem may be overcome by widening metallization lines, but widening can be detrimentally offset by the likelihood of short circuiting across metallization lines because nearby closest features may bridge and short or contaminant particles may bridge between metallization lines and create a short circuit.

The second significant problem occurs during fabrication of the metallization lines due to undesired exposure to the masking material and the excess reflectance problems caused by photolithographic light. Light exposure with excess reflectance results in the lateral thinning and/or the recession of a metallization line end of the masking material. Hence, either a thinned, receded, or discontinuous metallization line feature results. Although such excess reflectance may only thin the metallization line feature, thinning thereof will leave the metallization line feature vulnerable to electromigration failure.

In FIG. 1, it can be demonstrated that the excess reflectance problem does not usually occur where any given metallization line such as continuous line 3 has a nearby closest feature 16 such as the proximal edge of isolated line 2L relative to point A upon an edge of continuous line 3. Nearby closest feature 16 an edge of isolated line containing point A is at the distance of $\alpha_0$ from point A.

The problem of an excess reflectance may occur for metallization lines where the closest feature is at a distance greater than $\alpha_0$. For example, the exposed point C is located upon the same edge of continuous line 3 as point A. Point C is at a lateral-component distance from a nearest neighboring feature that is about evenly spaced between isolated lines 2L and 2R ends 11. Point C has at least one distant closest feature 24 at a distance $\gamma_0$, that is greater than distance $\alpha_0$. At point C above, and at point C' below on continuous line 3, it can be seen that continuous line 3 has respective open exposures, 20 and 21, due to the break in metallization lines that form the intersection between ends 11 of isolated lines 2L and 2R and between isolated lines 4L and 4R. Open exposures 20, 21, can cause excess reflectance at respective points C and C'.

Excess reflectance can also occur at other structures. In FIG. 1, it can be seen that isolated lines 2L and 4L, when scanned from left to right, each have a first right-angle direction change. For 2L it is downwardly vertical, and for 4L it is upwardly vertical. Each of these direction changes is followed by a second right-angle direction change that restores lines 2L and 4L to run parallel to continuous line 3. Upon continuous line 3 at the point B above, and the point B' below, it can be seen that the nearest features thereto are the distant closest features 24 and 25 that each have a diagonal distance of $\beta_0$ between respective points B and B' and distant closest features 24 and 25. It can be seen that points B and B' upon continuous line 3 also have excess space around them compared to point A. These excess spaces are respective enclosed exposures 18 and 19 of continuous line 3. These exposures are referred to as enclosed exposures because points B and B' ultimately have regional metallization line features both above and below, caused in this example by the occurrence of isolated lines 2L and 4L. Enclosed exposures 18 and 19 are likewise detrimental to patterning of the metallization lines similar to open exposures 20 and 21.

Other exposures to occurrences of isolated lines such as isolated lines 5L and 5R include the respective terminal end exposures 22 and 23. Here it can be seen that excess light exposure occurs during photolithographic layout due to the lack of any nearby closest feature 16 such as seen for continuous line 3 at point A.

Because of excess reflectance problems caused by light exposure near such spaces as enclosed exposures 18 and 19, open exposures 20 and 21, and terminal end exposures 22 and 23, there will result an ultimate lateral thinning and/or the recession of an end of the masking material, and either a thinned, receded, or discontinuous metallization line feature for a continuous metallization line. Even though such exposure may not cause a breach in the metallization line feature during fabrication, the thinning of the metallization line will leave the metal line vulnerable to electromigration failure.

The third significant problem caused by miniaturization is an enhanced possibility of an interstitial particulate occurrence or a fabrication error that will cause a bridge to form between adjacent metallization lines, thereby shorting out an associated device and causing the device to fail. The semiconductive device design and process engineer must thus balance the advantage of miniaturization against the disadvantage of causing shorting due to impurity bridging or fabrication imperfection bridging.

What is needed in the art is a metallization design and associated method of fabrication that avoids the problems of the prior art.

SUMMARY OF THE INVENTION

The present invention relates to a metallization line layout and fabrication thereof that avoids the creation of metallization line thinning and/or disappearance for excess reflectance-vulnerable metallization line features therein. The present invention accomplishes this objective by taking an existing metallization line layout that has been dictated by the fabrication of a semiconductor device array and by eliminating distant closest features that would otherwise cause the aforementioned problems that existed in the prior art. The method of eliminating distant closest features includes enhancing terminal ends of isolated metallization lines. The method of eliminating distant closest features also includes thickening metallization line widths to achieve substantially only nearby closest features. The method of eliminating distant closest features likewise includes filling spaces between metallization line features to achieve a substantially standard preferred distance between any given metallization line feature and its nearest closest metallization line feature. Additionally, the method of eliminating distant closest features includes staggered unavoidable exposures, after a fashion that causes any given metallization line feature that must have an exposure, to only have a single occurrence thereof on one side of the metallization line. The present invention also includes placing additional "dummy" metal shapes in open areas to create a nearby closest feature where the original layout did not provide for such a feature.

The metallization lines may include metals, alloys, and the like. The metallization lines may include doped polysilicon and the like. The metallization lines may include refractory metal nitrides, and the like. The metallization lines may also include superconductive ceramics and the like.

The present invention is carried out by providing a metallization line layout and determining the existence of a space between any point on a metallization line and the nearest feature on the closest neighboring metallization line. Further, a measurement of each such space is taken between the selected point and the nearest feature on the closest neighboring metallization line. Thereafter, it is determined whether the selected point on the metallization line is at a distance from the feature that is greater than a predetermined preferred distance. Where the distance is greater than the predetermined preferred distance, either the metallization line itself, the closest feature, or both are enhanced in size, preferably incrementally and globally, in a direction approaching the preferred distance. Following enhancement, a measurement of the space as enhanced is again taken between the point and its nearest feature. The process is repeated until substantially no nearest feature upon any metallization line is at a distance significantly different from the preferred distance. Additionally, the method assures that any exposure on one side of a metallization line is not coupled with an exposure on the exact opposite side of the metallization line, within a preferred minimal distance. In this way, excess exposure to a metallization line is limited to one side in the area of the exposure.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Reference will now be made to the drawings wherein like structures will be provided with like reference designations. It is to be understood that the drawings are diagrammatic and schematic representations of the embodiment of the present invention and are not drawn to scale.

Figure 1:
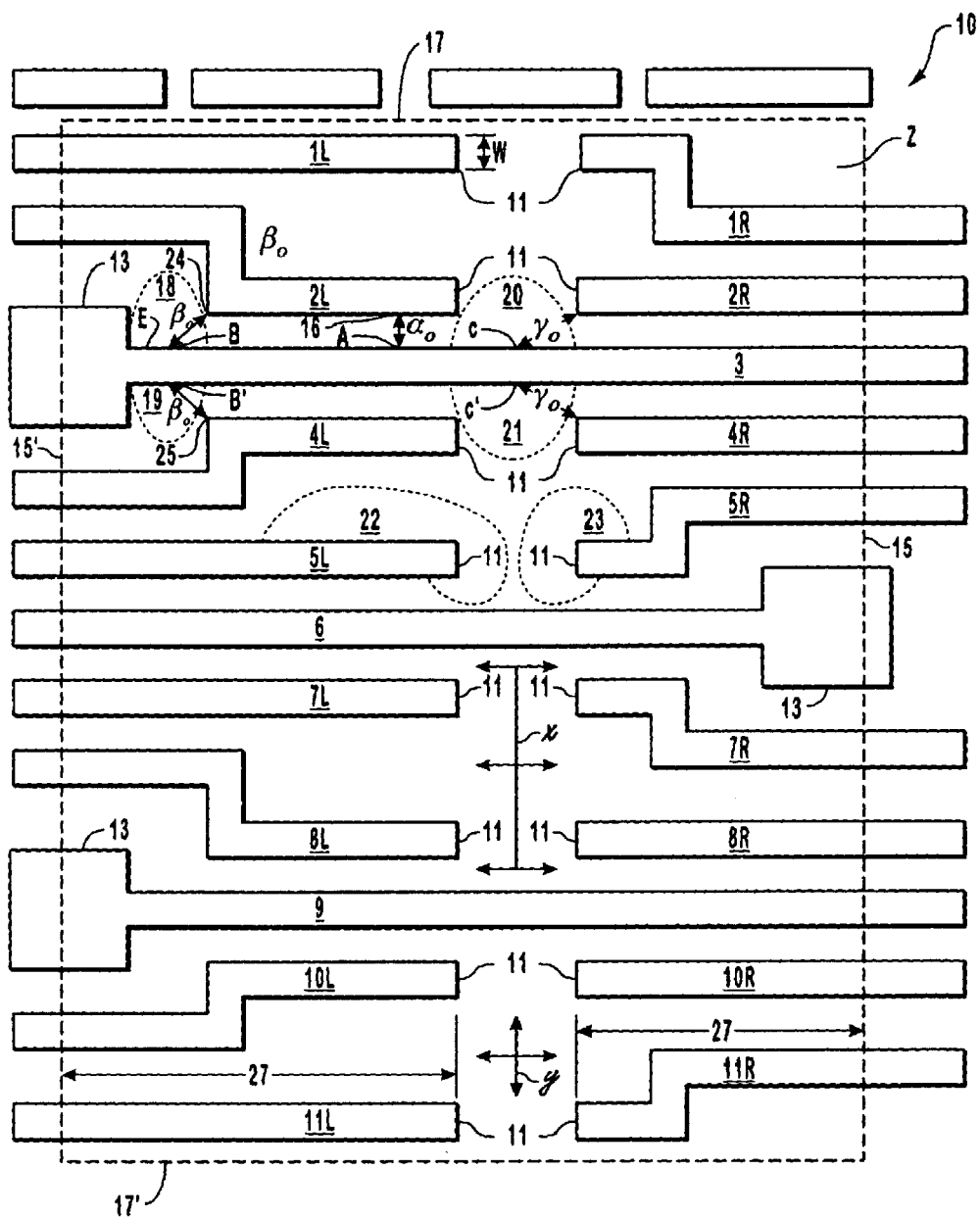
FIG. 1 is a typical prior art metal-1 layout of a sense amplifier. The metallization lines are configured at a minimum width and as far apart from each other as possible to avoid capacitive coupling and/or shorting due to defective metallization line fabrication.
Figure 2:
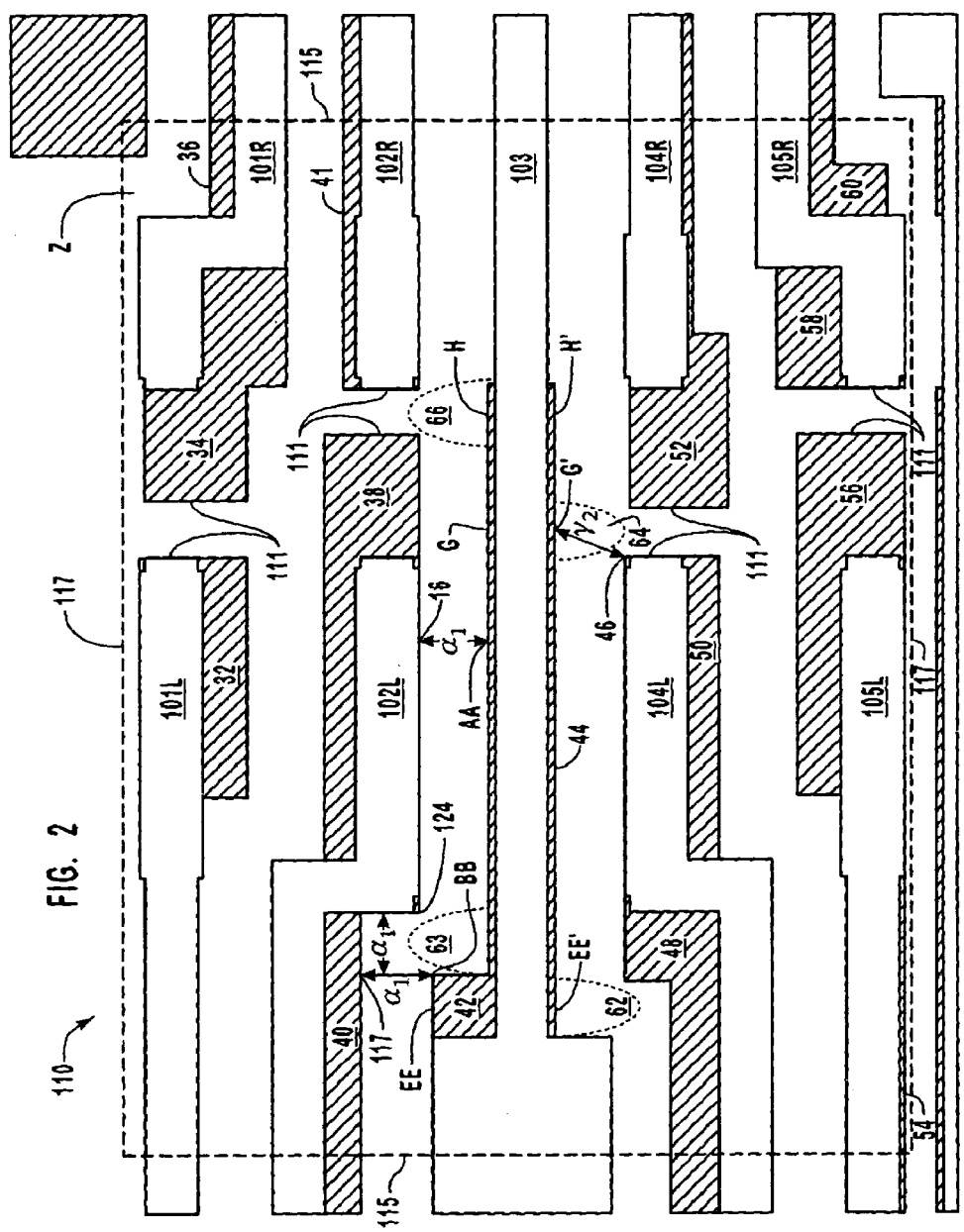
FIG. 2 shows the inventive metallization line layout superimposed on a portion of the metal-1 layout depicted in FIG. 1.

FIG. 2 illustrates an enlargement of the designing and preparation of metallization line layout 10, seen in FIG. 1, to form a metallization line layout 110 according to the present invention. In FIG. 2, it can be seen that isolated lines and continuous lines have been enhanced by additional material during the design process. Enhancements may comprise a simple vertical upward- or downward-directed enhancement, a combination of vertical and lateral enhancements, a simple lateral enhancement, or a corner enhancement. For example, line 101L has been enhanced by a line 1L vertical enhancement 32. Line 101R has been enhanced by both a line 1R vertical/lateral enhancement 34 and a line 1R vertical enhancement 36. Line 102L has been enhanced by a line 2L vertical enhancement 40 and a line 2L vertical/lateral enhancement 38. Line 102R has been enhanced by a line 2R vertical enhancement 41. Line 103 has been enhanced by a line 3 vertical/lateral enhancement 42 and by a line 3 vertical enhancement 44. Line 104L has been enhanced by a line 4L vertical/lateral enhancement 48 and a line 4L vertical enhancement 50. Additionally it can be seen that line 104L has been enhanced by a line 4L corner enhancement 46 as have several other lines. Line 104R has been enhanced by a line 4R vertical/lateral enhancement 52. Line 105L has been enhanced by a line 5L vertical enhancement 54 and by a line 5L vertical/lateral enhancement 56. Line 105R has been enhanced by a line 5R vertical enhancement 58 and a line 5R vertical/lateral enhancement 60. Other lines in FIG. 2 have been enhanced as characterized above.

Point A as depicted in FIG. 1 is represented in FIG. 2 as point AA. Point AA demonstrates that point A has moved vertically away from enhanced line 103 because of the vertical enhancement portion of line 3 vertical/lateral enhancement 42. The distance between enhanced line 102L and enhanced line 103 is represented as $\alpha_1$, a lesser distance than $\alpha_0$, seen in FIG. 1. Distance $\alpha_1$, represents a preferred distance that occurs between enhanced line 102L at nearby closest feature 16 and enhanced line 103 at point AA. In each case as set forth herein, the distance $\alpha_1$ is understood to be measured in a direction that departs from a first line, e.g., enhanced line 103 at point AA, perpendicularly therefrom and arrives at an edge of a second line, e.g., line 102L at nearby closest feature 16.

Point B, found in FIG. 1 between isolated line 2L and line 3 has also been vertically shifted upward to become point BB due to line 3 vertical/lateral enhancement 42. It can also be seen that the distance between point BB and nearby closest feature 117 as well as the distance between point BB and distant closest feature 124 are each substantially the preferred distance $\alpha_1$. By these enhancements, it can be seen that substantially any point of metallization between an arbitrary given point and a nearby closest feature will have a distance equal to about $\alpha_1$.

Where point AA lies between two parallel features separated by the distance of about $\alpha_1$, the problem of excess reflectance during photolithographic layout of metallization line layout 10 is substantially inconsequential. At point B, as illustrated in FIG. 1, the effect of excess reflectance during photolithographic layout of metallization line layout 10 has been diminished by the formation of point BB due to the addition of line 2L vertical enhancement 40 and line 3 vertical/lateral enhancement 42. Thereby, the excess reflectance effect of enclosed exposure 18, as seen in FIG. 1, is substantially diminished such that any given distance from point BB to a nearby closest feature, e.g., 117 or a distant closest feature 124, is substantially $\alpha_1$.

Not every arbitrarily selected point upon every metallization line can be separated by a nearby closest feature by a distance of about $\alpha_1$. Where the metallization line layout creates such features seen in FIG. 1 as enclosed exposures 18 and 19, open exposures 20 and 21, and terminal end exposures 22 and 23, another embodiment of the present invention reduces the detrimental effect of excess reflectance by staggering the occurrence of intersections between enhancement features where some intersection exposure is unavoidable. According to this embodiment, where a distance greater than $\alpha_1$ occurs between an arbitrarily chosen point and its closest feature after the inventive metallization line enhancement, the point found perpendicularly across the metallization line on the opposite edge of the arbitrarily chosen point will have a distance between that opposite edge and its closest feature of no greater than approximately $\alpha_1$. This embodiment is illustrated by observing exposure upon metallization lines. By way of example, reference is made to FIG. 2, points EE and EE', and points G and G'.

At point EE', upon enhanced line 103 in FIG. 2, it can be seen that a first enclosed exposure 62 exists at a region in a downward vertical direction from point EE'. The existence of first enclosed exposure 62 causes the likelihood of excess reflectance at point EE' during photolithographic layout of metallization line layout 10, such that a metallization line-thinning amount of excessive reflectance during light exposure might occur at point EE'. According to this embodiment of the present invention, the occurrence of line 3 vertical/lateral enhancement 42 minimizes the amount of unavoidable excess reflectance upon enhanced line 103 at the region exactly opposite (upwardly vertically depicted) from point EE', namely at point EE. It can be seen that point EE lies perpendicularly opposite point EE' across the major axis of enhanced line 103. Thus, point E, seen in FIG. 1, has been enhanced to reduce excess reflectance vulnerability of line 3.

In FIG. 2, the effect of reducing excess reflectance at point G is accomplished by staggering unavoidable intersections that must occur where isolated metallization lines have an end 111. When so staggered, the distance $\gamma_2$ is greater than $\alpha_1$ but less than the distance $\gamma_0$. This can be seen by example as the distance between point G' on one edge of enhanced line 103 and line 4L corner enhancement 46, $\gamma_2$, and the distance between point AA on another edge of enhanced line 103 and point 16, $\alpha_1$.

Point G, opposite to point G', upon enhanced line 103 is subjected to a reflectance exposure distance of only $\alpha_1$. However, above enhanced line 103, it can be seen that a second open exposure 66 has been left above a point H due to the presence of ends 111 of enhanced lines 102L, 102R to form an intersection. By comparison of the relative positions of first continuous line exposure 64 below point G' and second continuous line exposure 66 above point H, it can be seen that the occurrence of unavoidable exposures that expose enhanced line 103 have been horizontally offset from vertical edges 11 by a varying amount, and staggered among themselves. The offset distance between exposures is preferably greater than or equal to about $\alpha_1$ although it can be less, but not allowing exposures to vertically align. As such, no single segment of a metallization line will be subject to two exposures on exactly opposite sides thereof, such as points G and G', where G illustrates a point that is not exposed and is separated by $\alpha_1$ from a nearby closest feature on enhancement 38 of line 102L, and G' illustrates a point that is exposed at a distance $\gamma_2$ from the nearby closest feature in corner enhancement 46 of line 104L, where $\gamma_2 > \alpha_1$.

As seen in FIG. 1, the occurrence of terminal end exposures 22 and 23 also cause significantly greater amounts of reflectance that affect at least ends 11 of isolated metallization lines. The effect of staggering unavoidable exposures accomplishes both the resistance of unwanted thinning of terminal ends of isolated metallization lines, and likewise minimizes unavoidable reflectance to continuous metallization lines due to the presence of at least one open exposure. Thus, for enhanced line 103, first open exposure 64 may cause some weakening of enhanced line 103 at point G', but because second open exposure 66 is horizontally shifted away from point G on continuous line 103, by a distance preferably at least as great as $\alpha_1$, the effect of excess reflectance upon continuous line 103 at the localized line segment encompassing points G and G' is reduced by at least 50 percent.

It can thus be seen that the present invention accomplishes both the standardization of distances from any given point to its nearest closest feature not of the same metallization line, and, where it is unavoidable that a given point upon a metallization line will have an exposure, i.e., a closest feature located at a distance that is greater than the standardized distance $\alpha_1$, this exposure will occur only on one side of the metallization line within a lateral distance of at least $\alpha_1$.

Figure 3:
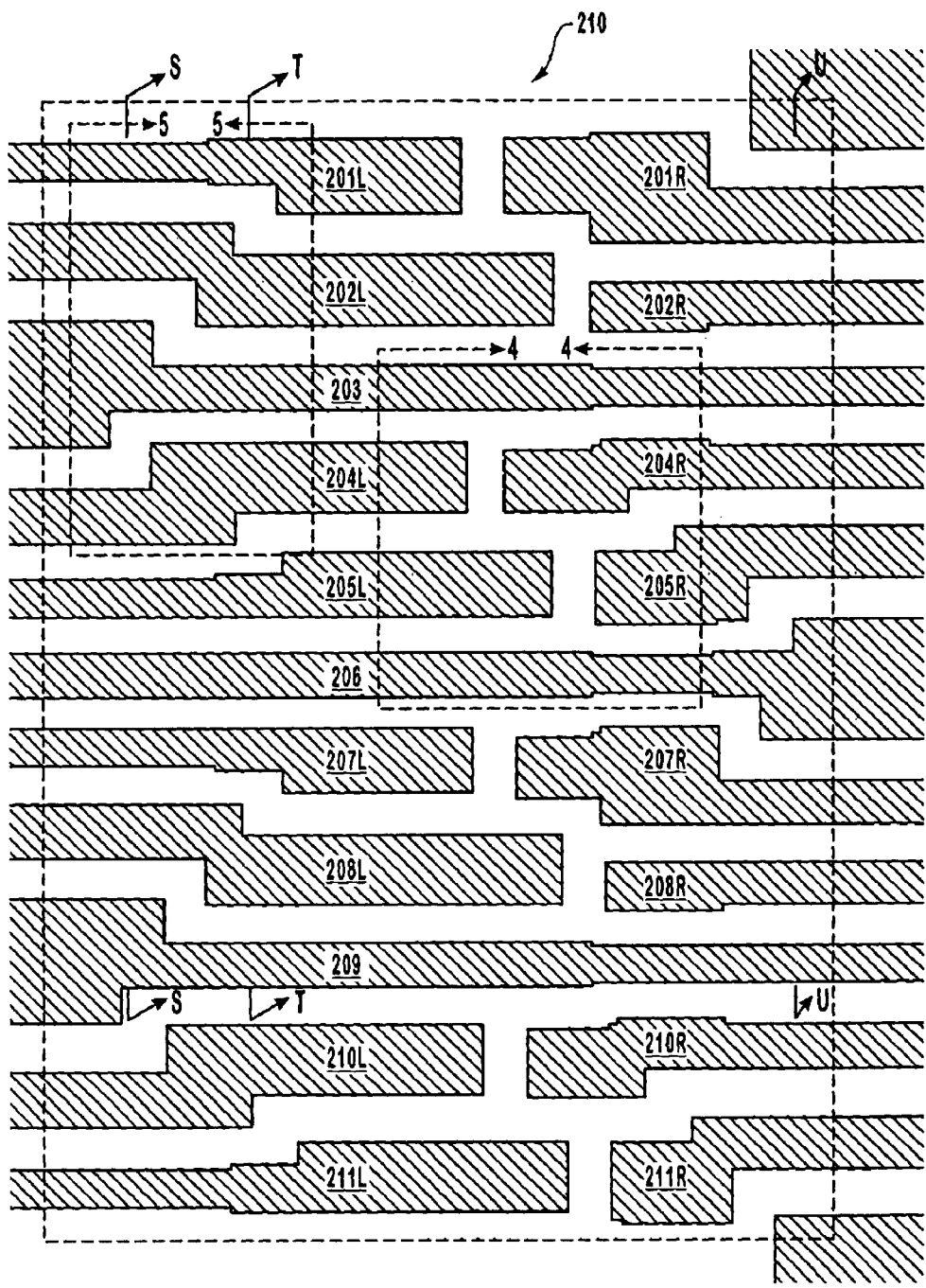
FIG. 3 shows the inventive metallization line layout of one embodiment of the present invention, wherein it can be seen that no standard 6-way intersection that separates metallization lines occurs upon the improved metallization line layout, and wherein it is illustrated that substantially standard spacing has been achieved throughout the entire improved metallization line layout.

FIG. 3 illustrates an improved metallization line layout 210 that is one embodiment of a metallization line layout as it would be prepared, by way of example, by a photolithographic process. It can be seen that a series of improved isolated metallization lines and improved continuous metallization lines appear to have somewhat arbitrary shapes. The shapes are methodically produced, with some variation possible, e.g., locating an intersection by shifting left instead of right, when presented with a given metallization line layout for a given device array.

Absent from the present invention is the occurrence of any cross-shaped, 4-way, or 6-way intersections created by at least four corners of metallization line features that are defined by having ends within a given localized area. It can be seen in FIG. 3 that the classic "Manhattan" layout of metallization lines is not present where no intersection in the present invention comprises a 4-way or 6-way intersection.

Figure 4:
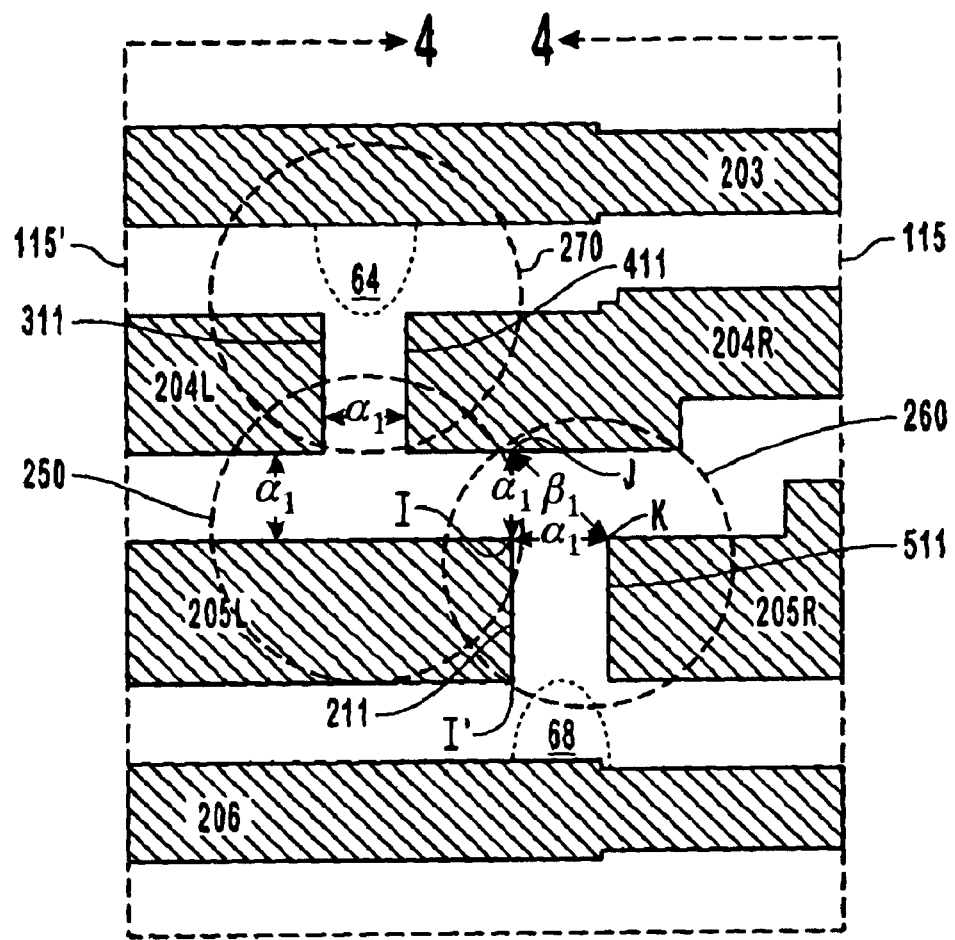
FIG. 4 is a detail section taken from FIG. 3 along the arbitrary rectangular boundary 4—4.

FIG. 4 is an enlarged detail section taken from FIG. 3 along the line 4—4. Therein it can be seen that ends 211, 311, 411, and 511 each have a distance from either of vertical boundaries 115, 115' that differs from any other of the ends. It can also be seen that each isolated line in FIG. 4 has an end 211, 311, 411, and 511, that has a length. It can also be seen that every isolated line end length is parallel to every other isolated line end length. Further, it can be seen that any parallel projection from any isolated line end length that intersects with its nearest neighboring metallization line is substantially the uniform distance $\alpha_1$ for all parallel-to-end-length projections therefrom. It can also be seen that no projection from any end namely any isolated line end length, projects through an exposure between adjacent isolated lines.

A corner may be defined as an edge of a line that begins at a boundary, that meets a first right angle direction change and that terminates at a second right angle direction change or at a second boundary. Thus, point I is a corner apex. This corner may be defined as beginning on improved line 205L at left vertical boundary 15' on its upper edge, meeting a first right angle direction change at point I, and terminating at a second right angle direction change at I'. It can also be seen in FIG. 4 that for a given point such as a point I, taken from an end 211 corner of improved line 205L, there is a distance to the nearby closest features J and K of about $\alpha_1$. Further, it can be seen that the distance between nearby closest features J and K will have a distance of about $\beta_1$, wherein $\beta_1$ is equal to about $\sqrt{2}\,\alpha_1$. Thus, for nearby closest feature J itself, it has a nearby closest feature I, at a distance of $\alpha_1$. Because point I is at end 211 of improved line 205L, it also has a nearby distant feature K, at a distance of $\beta_1$, or $\sqrt{2}\,\alpha_1$.

Figure 5:
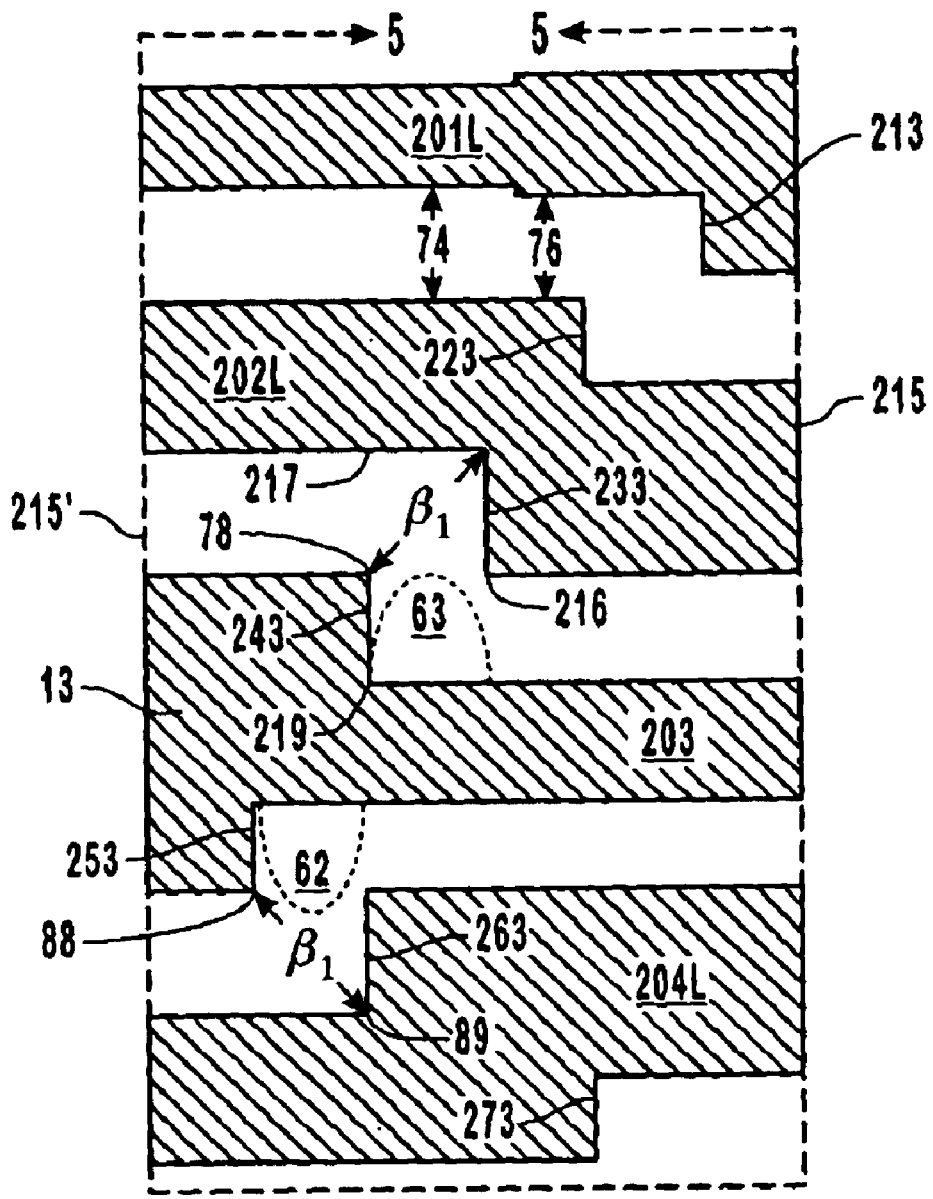
FIG. 5 is a detail section taken from FIG. 3 along the arbitrary rectangular boundary 5—5.

FIG. 5 is a detail section taken from FIG. 3 along the line 5—5. Therein, it can be seen that right angle direction change features occur to define corners where either the metallization line changes in overall direction or changes in width. Thus, in FIG. 5, improved line 202L at its lower edge begins to define a corner at left boundary 215', meets a first right angle direction change at inside corner apex 79, continues vertically downward along a right angle direction change edge 233, and terminates at nearby closest feature 216. Improved line 201L also has a right angle direction change edge 213 that has a length and that is also parallel to vertical boundaries 215, 215'. In a like manner, improved line 202L has right angle direction change edges 223 and 233. Improved line 203 has right angle direction change edges 243 and 253. Additionally, improved line 204L has right angle direction change edges 263 and 273. In each case, the right angle direction change edge has a length and the length runs substantially parallel to vertical boundaries 215, 215'.

First enclosed exposure 62 is formed by right angle direction change features 253 and 263. It can be seen that second enclosed exposure 63 is configured so as to have a horizontal distance from vertical boundary 215 that is different from first enclosed exposure 62. Similarly, improved line 203 forms an outside corner beginning at upper edge at left vertical boundary 215', meets first right angle direction change end 243 at a first outside corner apex 78, continues vertically downward along right angle direction change edge 243, and terminates at the next right angle which is an inside corner apex 219.

It can be seen in FIG. 5 that between improved lines 201L and 202L, a first distance 74 that is substantially equal to $\alpha_1$ is found by taking a line that is substantially perpendicular to the parallel features of improved lines 201L and 202L, but that a second distance 76 appears to be less than first distance 74 and thus likewise less than the distance $\alpha_1$. The occurrence of first distance 74 and second distance 76 is acceptable within the scheme of the present invention, wherein the variation of second distance 76 in comparison to first distance 74 is such that distance 76 is about 90% of distance 74, preferably about 96%, more preferably about 98%, and most preferably greater than 99%. The exact amount of variance between first distance 74 and second distance 76, as it may occur throughout improved metallization line layout 210, will depend upon the specific application and will depend upon process goals.

It can also be seen in FIG. 5 that a diagonal distance $\beta_1$ appears as being a measurement between outside corner apex 78 of improved line 203 and an inside corner apex 79 of improved line 202L. The distance $\beta_1$, however, is not the smallest distance between outside corner apex 78 of improved line 203 and its nearest neighboring feature. Rather, the nearby closest features are seen at 216 and 217. Nearby closest features 216 and 217 are separated from outside corner apex 78 of improved line 203 by a distance of about $\alpha_1$. By this illustration it can be seen that, although the distance $\beta_1$ may be present in the improved metallization line layout 210 seen in FIG. 3, the nearest feature to outside corner apex 78 is nearby closest feature 216 or feature 217. It is also preferable that distance $\beta_1$, is substantially equal to $\sqrt{2}\alpha_1$.

Another way of describing the structure seen in FIG. 5 is to call improved line 203 a first continuous line having a first convex edge defined by corner apex 78. Improved line 202L may be called a second continuous line having a concave edge defined at inside corner apex 79. First continuous line 203 is adjacent to second continuous line 202L and is spaced apart therefrom by a distance of about $\alpha_1$ where adjacent edges are substantially parallel. Further, inside corner apex 79 of the first concave edge is separated from outside corner apex 78 of the first convex edge by a diagonal distance of about $\sqrt{2}\alpha_1$. It is further clear that a projection from the first convex edge, defined at edges encompassing outside corner apex 78, to second continuous line 202L has a distance of about $\alpha_1$. It is further seen that first continuous line 203 has a second convex edge, defined at edges encompassing second outside corner apex 88 on an edge opposite the first convex edge. The structure in FIG. 5 is further defined by a third continuous line, in this case improved line 204L having a concave edge defined at inside corner apex 89. First continuous line 203 is adjacent to third continuous line 204L and opposite second continuous line 202L. Inside corner apex 89 of the concave edge of third continuous line 204L is separated from second outside corner apex 88 of the second convex edge by the distance of about $\sqrt{2}\alpha_1$. Further, vertical projections from respective corners of the first and second convex edges of first continuous line 203 to nearest adjacent continuous lines 202L, 204L respectively are measured by a distance of about $\alpha_1$.

Another embodiment of the present invention may be approximated in FIG. 5, wherein arcuate shapes are formed in the place of right-angle inside and outside corners. For example, where diagonal distance $\beta_1$ appears as being a measurement between outside corner apex 78 of improved line 203 and an inside corner apex 79 of improved line 202L, an arcuate shape for both outside corner apex 78 and inside corner apex 79 would allow the value of distance of $\beta_1$ to approach the preferred distance of $\alpha_1$. The decrease of distance $\beta_1$ to approach the preferred distance of $\alpha_1$ comes about by causing inside corner apex 79 to soften into a semicircular arc that may begin at near nearby closest feature 217 and that may end near nearby closest feature 216. Similarly, outside corner apex 78 may be softened into a semicircular arc of the same approximate arc length as that formed in place of inside corner apex 79. As such, all right-angle features are replaceable with arcuate features that may cause substantially all closest distances between lines to be about equal to about $\alpha_1$.

The improved metallization line layout, as seen in FIG. 3, or in detail in FIGS. 4 and 5, may include at least one of three possible distinct features. The first possible distinct feature, seen in FIGS. 3 and 4, is an offset, double 3-way intersection that is created by offsetting exposures that were caused by the adjacent occurrence of open exposure 21 and end exposures 22 and 23 seen in FIG. 1.

As seen in FIG. 4, a first 3-way intersection, located within an arbitrary subregion 250, is created near second open exposure 64. Thus in FIG. 4, improved line 204L is a first metallization line having a first end 311. Improved line 204R is a second metallization line having a second end 411. The respective first and second metallization lines, improved lines 204L and 204R have at least one edge and are substantially collinear at respective first and second ends 311, 411. The first and second ends 311, 411 are separated by a first distance $\alpha_1$ to form second open exposure 64 that exposes improved line 203.

This first 3-way intersection is completed by the presence of a third metallization line: improved line 205L. The third metallization line has an end 211 and is spaced apart from end 311 of line 204L by a distance of at least about $2\alpha_1$. End 211 is also spaced apart from end 411 of line 204R by the distance of about $\alpha_1$. In other words, the third metallization line 205L is separated from at least one of the first and second metallization lines equivalent to the first distance, $\alpha_1$ and end 211 is laterally offset from ends 311 and 411, by an amount greater than or equal to the first distance, $\alpha_1$. It is seen further that a projection from at least one end 311, 411 intersects third metallization line 205L at its upper edge.

The second 3-way intersection, located within an arbitrary subregion 260, is created near third open exposure 68. Accordingly, a fourth metallization line having an end 511 is provided. Where the third metallization line is line 205L, the fourth metallization line is line 205R. The third and fourth metallization lines may have at least one edge that are substantially collinear near ends 211, 511. The ends 211 and 511 are separated by about first distance a, to form second open exposure 68. First open exposure 64 upon improved line 203 and second open exposure 68 upon improved line 206 are laterally offset from each other when measured from either boundary 115, 115', by at least the first distance $\alpha_1$. In other 11 words, each exposure occurs at different distances from either of vertical boundaries 115, 115'. The double 3-way intersection is thus defined at ends 211, 311, 411, and 511 by spaces between metallization lines that make up two adjacent, offset open exposures 64 and 68.

A second possible distinct feature is the formation of a 3-way intersection by the presence of two isolated improved lines with an open exposure and an improved continuous line. Such a 3-way intersection, located within an arbitrary subregion 270, includes second open exposure 64 upon improved line 203. In FIGS. 3 and 4, improved line 204L is a first metallization line having end 311. Improved line 204R is a second metallization line having end 411. The first and second metallization lines, improved lines 204L and 204R have at least one edge are substantially collinear near ends 311 and 411. Ends 311 and 411 are separated by first distance a, to form second open exposure 64. This 3-way intersection is completed by the presence of a third metallization line: improved line 203. The third metallization line is adjacent and spaced apart parallel to the first and second metallization lines. In this example, third metallization line 203 lies parallel to collinear edges of improved lines 204L and 204R. Third metallization line 203 is separated from at least one of the first and second metallization lines by first distance, $\alpha_1$. This intersection is formed by including a portion of first open exposure 64, respective ends 311 and 411 of improved lines 204L and 204R, and continuous line 203.

A third possible distinct feature is illustrated in FIG. 5. This feature is the formation of metallization lines around an enlarged feature such as enlarged feature 13 that avoids detrimental enclosed exposures 18 and 19 as seen in FIG. 1. This third possible distinct feature can be described as a first metallization line such as improved line 203 that has first outside corner apex 78 and a second outside corner apex 88. Second outside corner apex 88 is upon a side of improved line 203 that is opposite the first outside corner apex 78. A second metallization line such as improved line 202L has a right-angle direction change edge 233 that forms inside corner at 79, that is complementary in shape to first outside corner at 78. The second metallization line is separated before right-angle direction change edge 233 at first outside corner apex 78 from its nearby closest features 216, 217 each by first distance, $\alpha_1$. The second metallization line is also separated at inside corner apex 79 by a second distance, $\beta_1$, equal to about 1.4 times first distance a, (about $\sqrt{2}\ \alpha_1$) at right-angle direction change edge 233. A third metallization line such as improved line 204L has a right angle direction change edge 263 that forms an inside corner apex 89 that is complementary in shape to second outside corner apex 88. The third metallization line is vertically separated from the second outside corner apex 88 by first distance $\alpha_1$ before the right-angle direction change and diagonally separated by second distance $\beta_1$ between inside corner apex 89 and second outside corner apex 88. It can be seen that first enclosed exposure 62 and second enclosed exposure 63 are laterally offset from each other, when measuring their distances from either of boundaries 215, 215', by at least distance $\alpha_1$. Thus, where right-angle direction change edge 253 is a given distance from left boundary 215', right-angle direction change edge 243 is the given distance from left boundary edge 215', plus at least the distance $\alpha_1$.

Figure 1A:
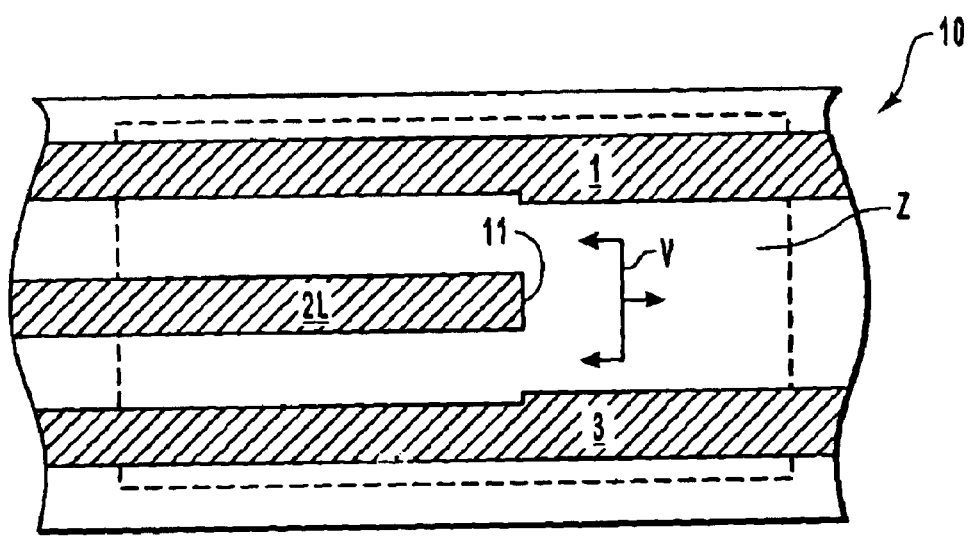
FIG. 1A illustrates a 3-way intersection of the prior art with uneven spacing between metallization lines and exposed and vulnerable terminal and lateral features.
Figure 6:
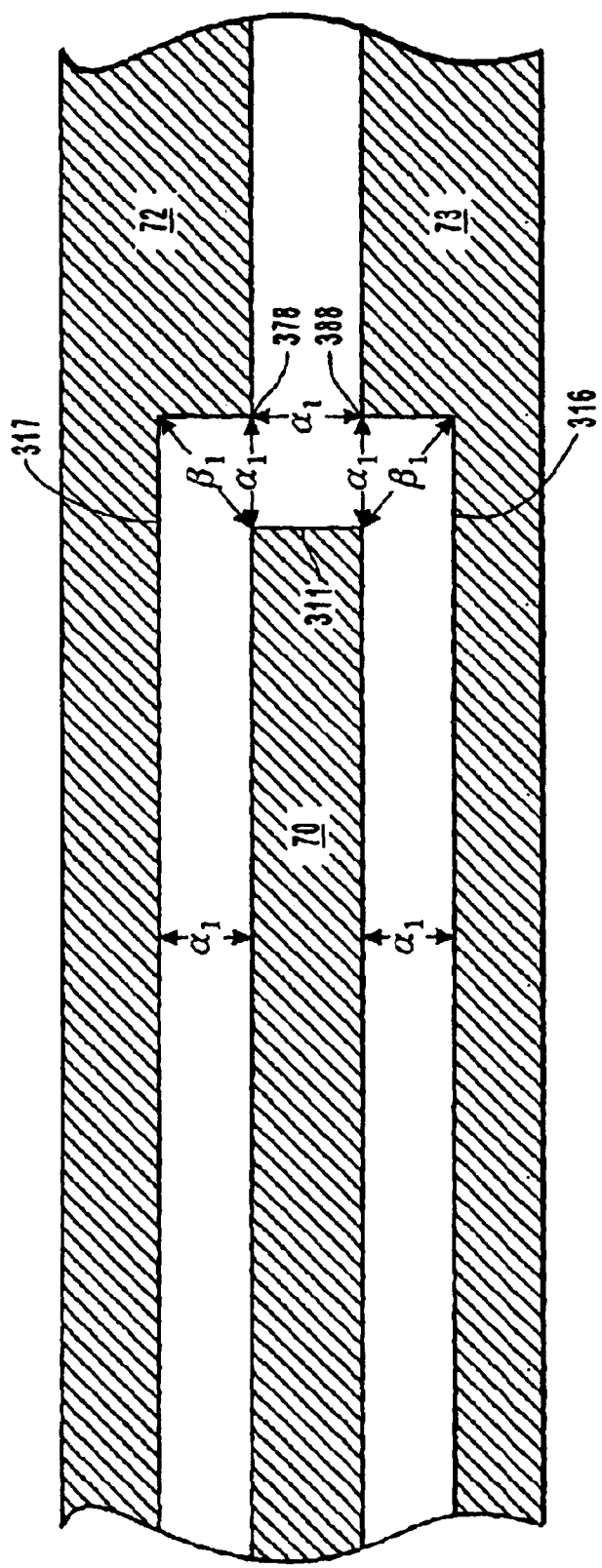
FIG. 6 shows the inventive metallization line layout as it appears in a preferred embodiment where a prior art 3-way intersection, consisting of two continuous lines and one interposed isolated line, has been enhanced.

FIG. 6 illustrates the inventive metallization line layout as it appears in an embodiment where a prior art 3-way intersection, such as that seen in FIG. 1A, has been enhanced. The 3-way intersection consisted of two continuous lines 72, 73 and one interposed isolated line 70. Enhancement of vertical portions of lines 72 and 73, line 72 being downwardly vertical to the right of end 311 and line 73 being upwardly vertical to the right of end 311, has resulted in the reduction of exposure and of likely excess reflectance. Thus, a measured perpendicular distance taken from end 311 of line 70 to nearby closest features 316, 317, or features 378, 388, either vertically or horizontally, results in a measured distance of $\alpha_1$.

Figure 7A:
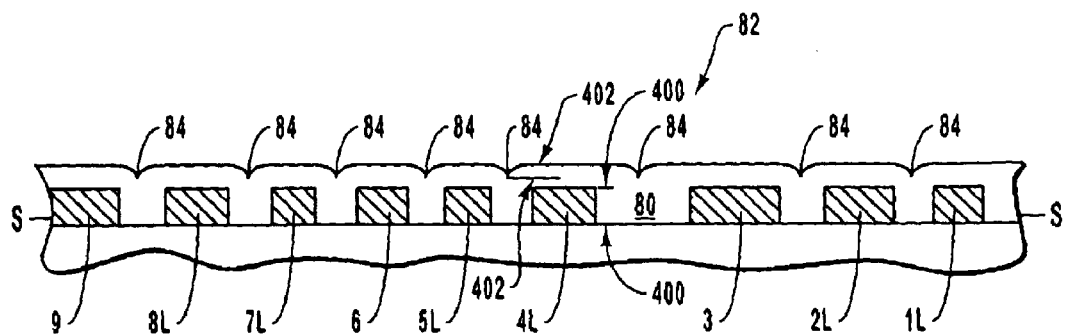
FIGS. 7A, 7B, and 7C illustrate three cross-sectional views of an improved metallization line layout wherein it can be seen that a planar upper surface is the result of ILD formation upon the inventive structure, without further processing required.
Figure 7B:
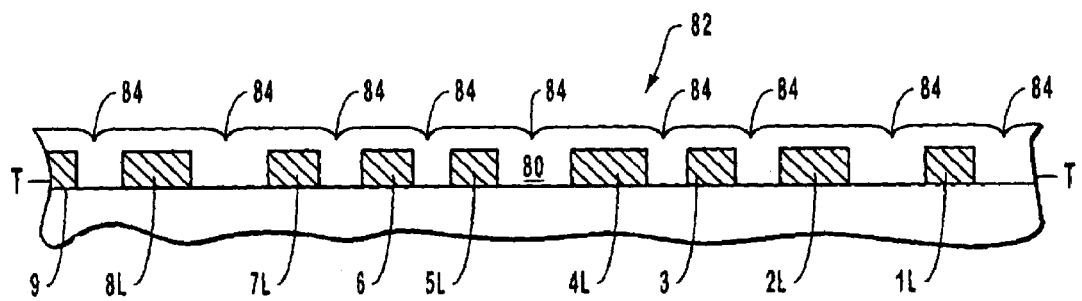
Figure 7C:
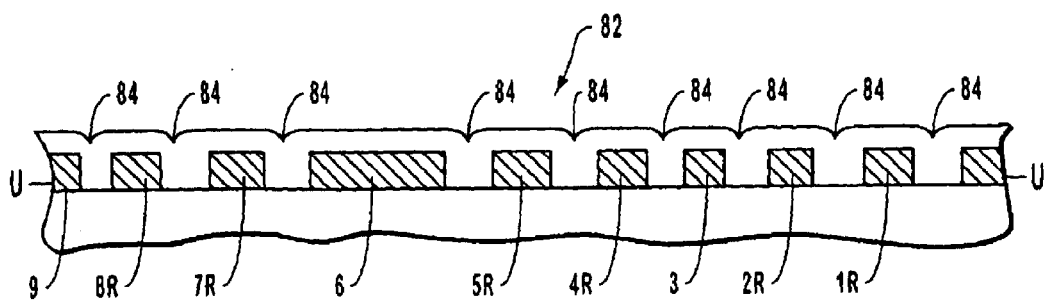

FIGS. 7A, 7B, and 7C illustrate cross-sectional views of the improved metallization line layout seen in FIG. 3, taken along the lines S—S, T—T, and U—U, respectively. Therein, it can be seen that both isolated and continuous lines have been covered with an interlayer dielectric layer (IDL) 80 that has a substantially planar upper surface 82 and is characterized by substantially fused trenches 84. Although it appears that the space between some features such as improved line 204L and improved line 203 in cross-section S—S is greater than elsewhere, the formation of substantially planar upper surface 82 is caused due to the location of distant closest features that are at a distance of no more than about $\sqrt{2}\ \alpha_1$ or about $1.4\alpha_1$. Thus, trench filling is substantially uniform to cause the formation of substantially planar upper surface 82 upon deposition of IDL 80.

The open depth of each occurrence of fused trench 84, open to planar upper surface 82, in order to make planar upper surface 82 substantially planar as far as the fabricator is concerned during subsequent fabrication thereof, is related to the line elevation 400 of the metallization lines. For example, improved line 4L, seen in FIG. 7a, has a line elevation 400. Fused trench 84 above and to the left of improved line 4L, has a trench depth 402. Preferably, fused trench depth 402 is about one half the depth equivalent to the amount of line elevation 400. Preferably, it is about ⅕ the depth more preferably about ¹⁄₁₀th the depth, even more preferably about ¹⁄₁₀₀th the depth of line elevation 400, and most preferably about ¹⁄₁₀₀₀th the depth of line elevation 400.

In review, it can be seen that the present invention provides an improved metallization line layout upon a semiconductor device including metallization lines each having at least one width and each having a length.

The improved metallization line layout creates offset exposures to minimize the unavoidable excess reflectance. The improved metallization line layout of the present invention also creates standard distances from any selected point upon an edge of a line to any nearby closest feature or to any nearby distant feature if present. The establishment of these standard distances allows for formation of an interlayer dielectric layer (IDL) that, when formed or deposited at a selected thickness upon the improved metallization line layout of FIG. 3, will result in a substantially planarized upper surface without the need for further processing. The substantially planarized upper surface eliminates the need for further processing of the IDL by properly dimensioning the spacing between nearest diagonally adjacent metallization features as described above. As such, there is an assurance that the IDL will cover a center point therebetween by the formation of fused trenches so as to be substantially planarized at the top surface thereof at a like height to the IDL over metallization features in the layout.

By implementing the present invention, the height of the top surface of the IDL will be the same over open spacing areas as well as over metallization features, and a substantially planarized IDL with fused trenches between metallization features will result after a single thin deposition of the IDL. By standardizing the spacing between nearest metallization features, and by standardizing the raise amount of the metallization lines in relation to the IDL thickness improved processing throughout an integrated circuit structure will result. A lesser amount of metal has to be etched which shortens etch processing time and increases throughput. The more uniform distribution of the metallization and non-metallization areas will also avoid local perturbations of a plasma during dry etching of the improved metallization line layout. Additionally, the upper surface of the IDL will be substantially planar without further processing.

With respect to deposition of an IDL, the present invention makes it possible to use a thinner layer of intermetal dielectric in that the spacing between metallization features is smaller due to its standardization. Thus, where conventional techniques like photoresist etchback or chemical-mechanical polishing (CMP) require an IDL having a conventional thickness, the present invention enables the deposition of an IDL having a thickness of less than about 80% the conventional thickness, preferably less than about 70%, more preferably less than about 50%, and most preferably about 40%. Conventional IDL deposition thicknesses are about 12,000 Å before etchback or CMP. The thinner IDL made possible by the present invention will require less deposition time and less material usage. Thus, a shorter throughput time results. In some embodiments, IDL thicknesses for the present invention, in order to achieve a substantially planarized upper surface upon deposition, are about one half the value of $\alpha_1$.

A method of fabricating an improved metallization line layout includes providing a given metallization line layout and practicing the inventive method. According to the inventive method, the fabricator receives a required metallization line layout scheme for a given device array. A point is chosen between two parallel metallization line features and the distance therebetween is determined. The distance is given a value of $\alpha_0$ and it is determined whether $\alpha_0$ is equal to or greater than a preferred distance $\alpha_1$. Where the distance is greater than the preferred distance $\alpha_1$, at least one vertical feature of at least one metallization line is enhanced until the distance between the two parallel features is substantially $\alpha_1$.

Where a metallization line has an end, thus creating isolated lines, the lateral distance between an end of an isolated line and its lateral counterpart (e.g. such as the distance between isolated lines 2L and 2R) are brought nearer by the horizontal enhancement of at least one end thereof. Where two isolated lines such as isolated lines 2L and 2R are adjacent to a continuous line such as line 3, a lateral enhancement such as line 2L vertical/lateral enhancement 38 shifts end 11 of line 2L to the right, and the layout of isolated lines 4L and 4R will have caused end 11 of isolated line 4R to be enhanced by shifting end 11 to the left. Thereby, FIGS. 2 and 3 illustrate that open exposures 20 and 21 are eliminated and are replaced with only first open exposure 64.

Figure 8:
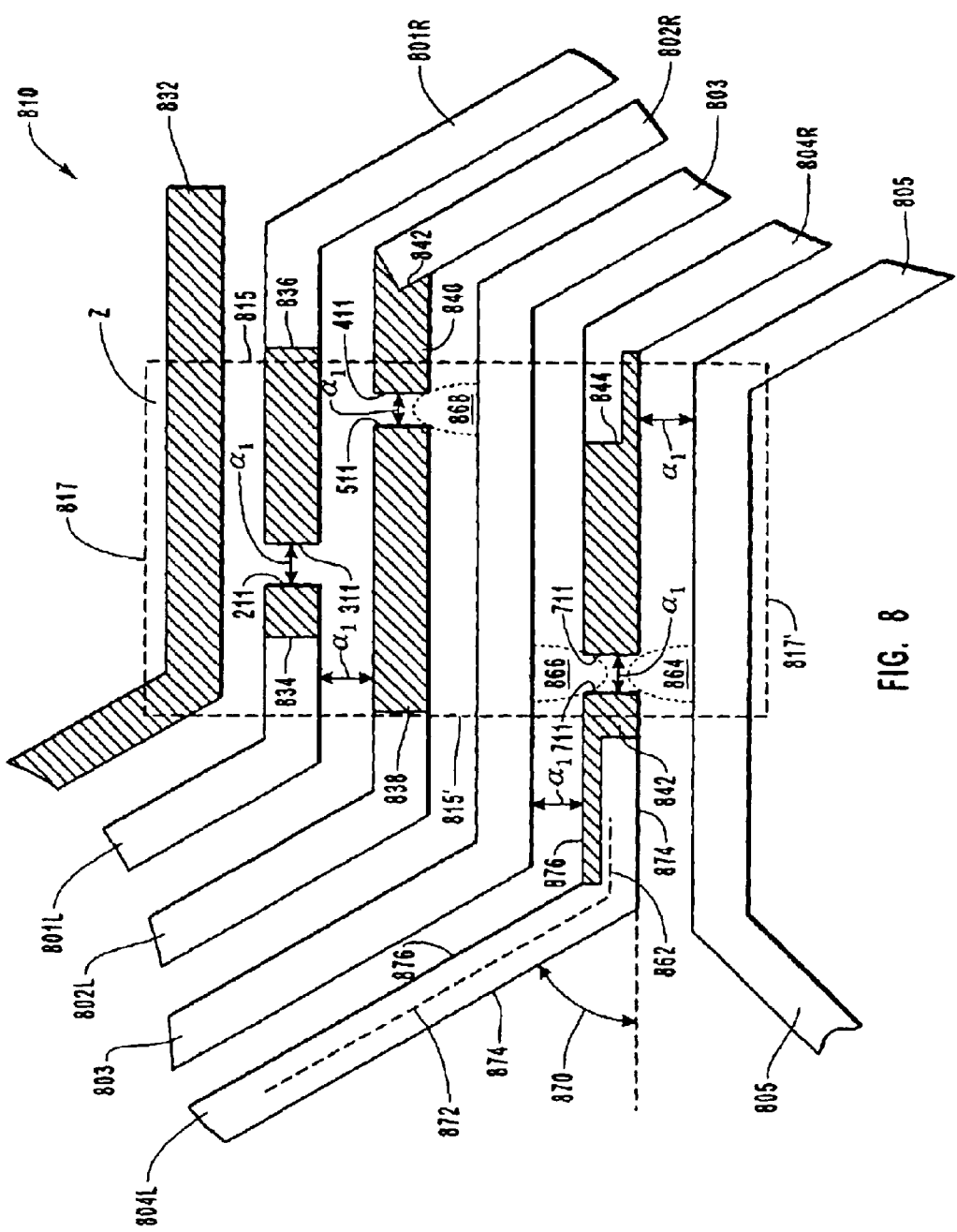
FIG. 8 is a plan view of an alternative embodiment of the present invention wherein non 90-degree metallization line direction changes occur about a symmetry line, and wherein the inventive process is applied in this region.

In some applications of the present invention, a non-Manhattan style layout may occur. In other words, where metallization lines are not all oriented with right-angle direction changes, non 90-degree features may be necessary for completing circuits. FIG. 8 illustrates a non-Manhattan style layout 810 as a possible subset of a larger layout. Layout 810 has metallization lines that have direction changes that are not orthogonal. A symmetry line 872 is depicted as being equidistant from respective parallel edges 874, 876 of a metallization line such as isolated line 804L. Symmetry line 872 illustrates that a metallization line 804L is symmetrical about symmetry line 872 and symmetry line 872 has a non-orthogonal direction change to form a non-orthogonal angle.

For example, an angle 870 is depicted as being about 65 degrees; in any event, angle 870 is not orthogonal. Angle 870 may be in a range from about 1 degree to about 89 degrees. Angle 870 more preferably is in a range from about 10 degrees to about 80 degrees. Typically, the angle such as angle 870 will be about 45 degrees where possible. The specific degree of the angle that defines a direction change in a metallization line will depend upon layout requirements.

FIG. 8 illustrates the inventive method and layout. Enlargement of metallization lines during the designing and preparation of a metallization line layout 810 according to the present invention is similar to the illustrated discussion of FIG. 2. Layout 810 has an arbitrary region Z imposed upon it for illustrative purposes. FIG. 8 also illustrates that enhancement of metallization lines may take a reference from an existing continuous metallization line such as a metallization line 803 or a metallization line 805 within the arbitrary region Z. As such, parallel edges of enhancements may lie parallel with parallel horizontal boundaries 817 and 817'. Likewise, parallel ends of enhancements may lie parallel with parallel vertical boundaries 815 and 815'.

FIG. 8 illustrates that isolated metallization lines and continuous metallization lines have been enhanced by material during the design process. Additionally, FIG. 8 illustrates a perimeter metallization line 832 that has been formed next to two otherwise exposed isolated metallization lines, 801L and 801R. In other words, but for the presence of perimeter metallization line 832, metallization lines 801L and 801R would have been subject to both terminal-end exposures and lateral exposures such as those illustrated in FIG. 1.

Metallization line 801L has been enhanced by a lateral enhancement 834. Metallization line 801R has been enhanced by lateral enhancement 836. Lateral enhancement 834 extends the end 211 toward metallization line 801R and lateral enhancement 836 extends the end 311 toward metallization line 801L. Optionally, either of metallization lines 801 may be extended without the other where neighboring metallization lines may allow in order to achieve a preferred distance between ends of about $\alpha_1$ as set forth above. Each of end 211 and end 311 have a length that is parallel to parallel vertical boundaries 815 and 815'. Further, ends 211 and 311 are spaced apart by the preferred distance of about $\alpha_1$ as set forth above.

Metallization line 802L has been enhanced by a lateral enhancement 838. Metallization line 802R has been enhanced by an angular enhancement 840 that causes its end 411 to lie parallel to the end 511 of lateral enhancement 838 of metallization line 802L. Each of end 411 and end 511 have a length that is parallel to parallel vertical boundaries 815 and 815'. Further, ends 411 and 511 are spaced apart by the preferred distance of about $\alpha_1$ as set forth above.

Metallization line 803 has been unchanged as illustrated in FIG. 8. Metallization line 804L has been enhanced by a vertical/lateral enhancement 842. The vertical portion of the enhancement closes the spaced-apart distance between metallization line 803 and metallization line 804L to a preferred distance such as about $\alpha_1$ as set forth above. Metallization line 804R has been enhanced by a vertical/lateral enhancement 844. The vertical portion of enhancement 844 closes the distance between metallization line 804R and the metallization line 805 to the preferred distance of about $\alpha_1$ as set forth above. Additionally, the lateral enhancements of enhancements 842 and 844 also have parallel ends 611 and 711, respectively. Further, ends 611 and 711 are spaced apart by the preferred distance of about $\alpha_1$ as set forth above. As a result, continuous metallization line open exposures 866 and 868 on metallization line 803 are reduced to the minimum as discussed above. Further the ends 411 and 511 are set at different distances than the ends 611 and 711 or the ends 211 and 311, from either of parallel vertical boundaries 815, 815' of arbitrary region Z.

Metallization line 805 is a continuous metallization line that has an open exposure 864 that has been reduced to the preferred minimum by the placement of enhancements 842 and 844 according to the present invention. FIG. 8 illustrates that ends 211, 311, 411, 511, 611, and 711 each have a distance from either of vertical boundaries 115, 115' that differs from any other of the ends. However, either of end 211 or end 311 may have the same distance from either of vertical boundaries 115, 115' where two metallization lines, such as metallization line 802L and metallization line 803 lie therebetween. It is only preferred to avoid any open exposures upon any given metallization line directly across from any other open exposure on that metallization line.

FIG. 8 also illustrates that each isolated metallization line has an end that has a length. It can also be seen that every isolated metallization line end length is parallel to every other isolated metallization line end length. Further, it can be seen that any parallel projection from any isolated metallization line end length that intersects with its nearest neighboring metallization line is substantially the uniform distance $\alpha_1$ for all parallel-to-end-length projections therefrom. It can also be seen that no projection from any end, namely any isolated metallization line end length, projects through an exposure between adjacent isolated metallization lines.

Similar to what is illustrated in FIG. 4, comparison of the relative positions of continuous metallization line exposures 864, 866, and 868 illustrates that the occurrence of unavoidable exposures that expose continuous metallization lines 803 and 805 within arbitrary region Z, have been horizontally offset from vertical edges 15 by a varying amount, and staggered among themselves. The offset distance between continuous metallization line exposures is preferably greater than or equal to about $\alpha_1$ although it can be less, but not allowing exposures to vertically align. As such, no single segment of a metallization line will be subject to two exposures on exactly opposite sides thereof as discussed above.

The inventive method of fabricating a metallization line layout may be summarized by providing a preliminary metallization line layout, and detecting spaces between a first metallization line and an adjacent second metallization line. After detecting spaces, the method continues by measuring a perpendicular distance between adjacent edges of the first metallization line and the second metallization line, wherein the adjacent edges are a first edge on the first metallization line closest to the second metallization line and a second edge on the second metallization line closest to the first metallization line. Next the perpendicular distance is compared to a preferred distance, and a portion of at least one of the first edge and second edge is selected if the perpendicular distance is less than the preferred distance. After comparing, shifting of at least one of the first edge and second edge is carried out in a direction to cause the perpendicular distance to approach the preferred distance. After the distances have been narrowed to the preferred distance, patterning of the metallization line layout is carried out.

Additionally, dummy metallization lines may be placed upon the layout where spaces between electrically conductive lines are significantly large. The dummy metallization lines may be placed in lieu of electrically conductive metallization line enhancement.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of fabricating a metallization line layout for a semiconductor device array, comprising:

providing a first metallization line layout;

detecting spaces between a first metallization line and an adjacent second metallization line;

measuring a perpendicular distance between adjacent edges of said first metallization line and said second metallization line, said adjacent edges being a first edge on said first metallization line closest to said second metallization line and a second edge on said second metallization line closest to said first metallization line;

comparing said perpendicular distance to a preferred distance;

selecting a portion of at least one of said first edge and said second edge when said perpendicular distance is less than said preferred distance; and shifting at least one of said first edge and said second edge in a direction to cause said perpendicular distance to become about said preferred distance to generate a second metallization line layout.

2. A method of fabricating a metallization line layout according to claim 1, further comprising patterning said second metallization line layout.

3. A method of fabricating a metallization line layout according to claim 1, further comprising:

forming an interlayer dielectric layer upon said first or second metallization line layout, said interlayer dielectric layer having a substantially planar top surface, wherein said substantially planar top surface is obtained upon forming said interlayer dielectric layer without planarizing said top surface.

4. A method of fabricating a metallization line layout according to claim 1, wherein said shi fling comprises the addition of a material in contact with at least one of said first edge and said second edge, and said material is at least one of a metal, an alloy, and combinations thereof.

5. A method of fabricating a metallization line layout according to claim 1, wherein said shifting comprises the addition of a material in contact with at least one of said first edge and said second edge, and said material comprises doped polysilicon.

6. A method of fabricating a metallization line layout according to claim 1, wherein said shifting comprises the addition of a material in contact with at least one of said first edge and said second edge, and said material comprises at least one refractory metal nitride.

7. A method of fabricating a metallization line layout according to claim 1, wherein said shilling comprising the addition of a material in contact with at least one of said first edge and said second edge, and said material comprises at least one superconductive ceramic.

8. A method of fabricating a metallization line layout according to claim 1, wherein said shifting comprises the addition of a material in contact with at least one of said first edge end said second edge.

9. A method of fabricating a metallization line layout for a semiconductor device array, comprising:

providing a first metallization line layout;

detecting spaces between a first metallization line and an adjacent second metallization line;

measuring a perpendicular distance between adjacent edges of said first metallization line and said second metallization line, said adjacent edges being a first edge on said first metallization line closest to said second metallization line and a second edge on said second metallization line closest to said first metallization line;

comparing said perpendicular distance to a preferred distance;

selecting a portion of at least one of said first edge and said second edge when said perpendicular distance is less than said preferred distance;

shifting at least one of said first edge and said second edge in a direction to cause said perpendicular distance to become about said preferred distance to generate a second metallization line layout;

patterning said second metallization line layout; and forming an interlayer dielectric layer upon said first or second metallization line layout.

10. A method of fabricating a metallization line layout according to claim 9, wherein said shifting comprises the addition of a material in contact with at least one of said first edge and said second edge.

11. A method of fabricating a metallization line layout according to claim 9, wherein said first and second metallization lines comprise metals or alloys thereof.

12. A method of fabricating a metallization line layout according to claim 9, wherein said first and second metallization lines comprise doped polysilicon.

13. A method of fabricating a metallization line layout according to claim 9, wherein said first and second metallization lines comprise at least one refractory metal nitride.

14. A method of fabricating a metallization line layout according to claim 9, wherein said first and second metallization lines comprise at least one superconductive ceramic.

* * * * *